(12) United States Patent
Kimura

(10) Patent No.: US 7,095,602 B1
(45) Date of Patent: Aug. 22, 2006

(54) CERAMIC STRUCTURE AND NONRECIPROCAL CIRCUIT DEVICE

(75) Inventor: Masahiro Kimura, Yasu (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 11/170,472

(22) Filed: Jun. 29, 2005

(51) Int. Cl.
*H01G 4/228* (2006.01)

(52) U.S. Cl. .................... 361/306.3; 361/313

(58) Field of Classification Search ........ 361/311–313, 361/321.2, 321.3, 328–330, 792–795, 306.3; 174/255–260; 428/209–210, 156, 131, 306.3
See application file for complete search history.

(56) References Cited

U.S. PATENT DOCUMENTS

| | | | | |
|---|---|---|---|---|
| 4,800,459 A | * | 1/1989 | Takagi et al. ............ | 361/321.2 |
| 5,855,995 A | * | 1/1999 | Haq et al. ................ | 428/210 |
| 5,976,286 A | * | 11/1999 | Natarajan ................ | 156/60 |
| 6,146,743 A | * | 11/2000 | Haq et al. ................ | 428/210 |
| 6,528,145 B1 | * | 3/2003 | Berger et al. ............ | 428/156 |
| 6,711,029 B1 | * | 3/2004 | Fisher et al. ............ | 361/792 |

FOREIGN PATENT DOCUMENTS

| | | |
|---|---|---|
| JP | 11-135711 | 5/1999 |
| JP | 2003-304064 | 10/2003 |
| JP | 2004-207495 | 7/2004 |

\* cited by examiner

*Primary Examiner*—Anthony Dinkins

(57) ABSTRACT

A method of forming a ceramic structure includes disposing substrate-forming ceramic green sheets having conductors, internal conductors, and via conductors so as to sandwich connecting member-forming ceramic green sheets having via conductors, followed by lamination and bonding thereof by pressure application, with the conductors being formed using a conductive paste primarily composed of a powdered metal, so that a ceramic laminate composed of ceramic molded bodies laminated to each other is formed. The ceramic laminate is fired at a temperature at which the substrate-forming ceramic green sheets are sintered and the connecting member-forming ceramic green sheets are not sintered and at a temperature not more than the melting point of the metal, and subsequently, the connecting member-forming ceramic green sheets are removed from the fired composite laminate, thereby forming a ceramic structure.

5 Claims, 17 Drawing Sheets

CERAMIC STRUCTURE AND NONRECIPROCAL CIRCUIT DEVICE

BACKGROUND OF THE INVENTION

1. Field of the Invention

The present invention relates to a ceramic structure having a plurality of ceramic sintered bodies connected to each other with connecting members interposed therebetween, a method for manufacturing the ceramic structure, and a nonreciprocal circuit device including the ceramic structure.

2. Description of the Related Art

In recent years, concomitant with the trend toward miniaturization, weight reduction, and reduction in thickness of electronic devices, reduction in height thereof has been required. Accordingly, the reduction in height of electronic devices has been achieved by mounting semiconductor devices or the like in a multilayer structure which is formed of a plurality of ceramic substrates. In this case, the ceramic substrates are connected to each other with electrically conductive bumps provided therebetween.

FIG. 17 is a schematic cross-sectional view showing a related ceramic structure. As shown in FIG. 17, ceramic substrates 901a and 901b are connected to each other via conductive bumps 903 formed on electrode pads 902, the conductive bumps 903 being composed of solder or the like. The electrode pads 902 are connected to conductors 904 located inside of the ceramic substrates 901a and 901b (for example, see Japanese Unexamined Patent Application Publication No. 11-135711 (pp. 4 to 7 and FIG. 4).

The ceramic substrates 901a and 901b are connected to the conductive bumps 903 as described below. First, metal balls are molten and provided on the electrode pads 902, and the ceramic substrate 901b with the metal balls tightly fixed thereto is pressed onto a flat surface of a base substrate, so that balls partly having a flat surface are obtained. The balls partly having a flat surface are brought into contact with a conductive adhesive applied on a support substrate so that the conductive adhesive is transferred onto the balls, and after the balls thus obtained are positioned so as to be brought into contact with a conductive pattern 905 of the ceramic structure 901a, the ceramic substrates 901a and 901b are connected to each other.

However, in the method described above, it is necessary that the ceramic substrates 901a and 901b be formed beforehand and be positioned to be electrically connected to each other. In addition, since the conductive bump 903 is formed by melting a metal ball, it is difficult to control the shape of the metal ball after melting. Furthermore, when the metal ball is connected to the substrate by applying a pressure, displacement of the metal ball may occur in some cases. Hence, it has been difficult to form the conductive bump 903 as it is designed.

SUMMARY OF THE INVENTION

In order to overcome the problems described above, preferred embodiments of the present invention provide a ceramic structure in which positioning of constituent elements can be easily performed and the shape of a connecting member can be formed as it is designed.

In accordance with a first preferred embodiment of the present invention, a ceramic structure includes ceramic sintered bodies having conductors on surfaces thereof and provided at a predetermined interval therebetween, and connecting members provided between the ceramic sintered bodies. In this ceramic structure, the connecting members are made of a pillar-shaped sintered metal and electrically and mechanically connect two ceramic sintered bodies adjacent to each other through conductors on surfaces thereof.

In the ceramic structure according to the first preferred embodiment of the present invention, the connecting members and the conductors are preferably connected to each other without solder interposed therebetween.

In the ceramic structure according to the first preferred embodiment of the present invention, the two adjacent ceramic sintered bodies with the connecting members interposed therebetween are preferably composed of different ceramic materials.

In the ceramic structure according to the first preferred embodiment of the present invention, at least one of the two adjacent ceramic sintered bodies with the connecting members interposed therebetween may be a ceramic multilayer substrate.

In the ceramic structure according to the first preferred embodiment of the present invention, the surfaces of the two adjacent ceramic sintered bodies on which the conductors are provided are preferably major surfaces thereof, the connecting members may electrically and mechanically connect the two adjacent ceramic sintered bodies to each other through the conductors on the major surfaces thereof, and the ceramic structure may further include at least one thick-film resistor on at least one of the major surfaces of the two adjacent ceramic bodies.

In the ceramic structure according to the first preferred embodiment of the present invention, the surfaces of the two adjacent ceramic sintered bodies on which the conductors are provided are preferably major surfaces thereof, the connecting members may electrically and mechanically connect the two adjacent ceramic sintered bodies to each other through the conductors on the major surfaces thereof, and the ceramic structure may further include an electronic component mounted on one of the major surfaces of the two adjacent ceramic bodies.

In the ceramic structure according to the first preferred embodiment of the present invention, it is preferable that a first of the two adjacent ceramic sintered bodies with the connecting members interposed therebetween have the conductor on one major surface thereof and be a frame-shaped ceramic substrate having a through-hole penetrating from one major surface to the other major surface, and a second of the two adjacent ceramic sintered bodies be a ceramic substrate having the conductor on one major substrate thereof, the first ceramic sintered body being located above the second ceramic sintered body, and the connecting members electrically and mechanically connect the two adjacent ceramic sintered bodies to each other through the conductors on the major surfaces thereof.

In the ceramic structure according to the first preferred embodiment of the present invention, it is preferable that the ceramic sintered bodies having conductors on surfaces thereof be a first, a second, and a third ceramic substrate, the first ceramic substrate and the second ceramic substrate be laminated to each other with connecting members interposed therebetween so that a predetermined space is present between the ceramic substrates, the first ceramic substrate and the third ceramic substrate be laminated to each other with connecting members interposed therebetween so that a predetermined space is present between the ceramic substrates, the second ceramic substrate and the third ceramic substrate be provided at one major surface side of the first ceramic substrate so as to face each other with a predetermined space therebetween, and the one major surface of the first ceramic sintered body and side surfaces of the second and the third ceramic sintered bodies facing each other define a recess portion.

In accordance with a second preferred embodiment of the present invention, a method for manufacturing a ceramic structure includes the steps of preparing ceramic molded bodies having conductors on surfaces thereof, preparing connecting member-forming ceramic green sheets which are not sintered at a temperature for sintering the ceramic molded bodies and which have via conductors in the thickness direction, forming a composite laminate by laminating the ceramic molded bodies and the ceramic green sheets so that the ceramic green sheets are provided between the ceramic molded bodies, firing the composite laminate at a temperature at which the ceramic molded bodies are sintered and the ceramic green sheets are not sintered and at a temperature not more than the melting point of a metal forming the via conductor, and removing the ceramic green sheets from the fired composite laminate.

In the method for manufacturing a ceramic structure according to the second preferred embodiment of the present invention, ceramic molded bodies adjacent to each other with the ceramic green sheets interposed therebetween are preferably composed of different ceramic materials.

The method for manufacturing a ceramic structure according to the second preferred embodiment of the present invention may further include the steps of preparing shrinkage-suppression ceramic green sheets which are not sintered at a temperature at which the ceramic molded bodies are fired, placing the composite laminate on at least one of the shrinkage-suppression ceramic green sheets, placing the rest of the shrinkage-suppression ceramic green sheets on the composite laminate, firing the shrinkage-suppression ceramic green sheets at a temperature at which the shrinkage-suppression ceramic green sheets are not sintered at the same time when the composite laminate is fired at the temperature at which the ceramic molded bodies are sintered and the connecting member-forming ceramic green sheets are not sintered and at a temperature not more than the melting point of the metal forming the via conductor, and removing the shrinkage-suppression ceramic green sheets from the fired composite laminate when the connecting member-forming ceramic green sheets are removed therefrom.

In the method for manufacturing a ceramic structure according to the second preferred embodiment of the present invention, the shrinkage-suppression green sheets are preferably provided with via conductors arranged in the thickness direction.

In accordance with a third preferred embodiment of the present invention, a nonreciprocal circuit device includes a permanent magnet, a ferrite to which a direct-current magnetic field is applied by the permanent magnet, a plurality of central electrodes provided for the ferrite, a multilayer substrate having a matching circuit electrically connected to one end of each of the central electrodes, and a yoke electrically connected to the other end of each of the central electrodes so as to function as the ground. In the nonreciprocal circuit device described above, the multilayer substrate includes the ceramic structure described above having the first, second, and the third ceramic substrates, and the bottom portion of the yoke is fitted to the recess portion of the ceramic structure.

Other features, elements, steps, characteristics and advantages of the present invention will become more apparent from the following detailed description of preferred embodiments thereof with reference to the attached drawings.

DETAILED DESCRIPTION OF THE PREFERRED EMBODIMENTS

Figure 1:
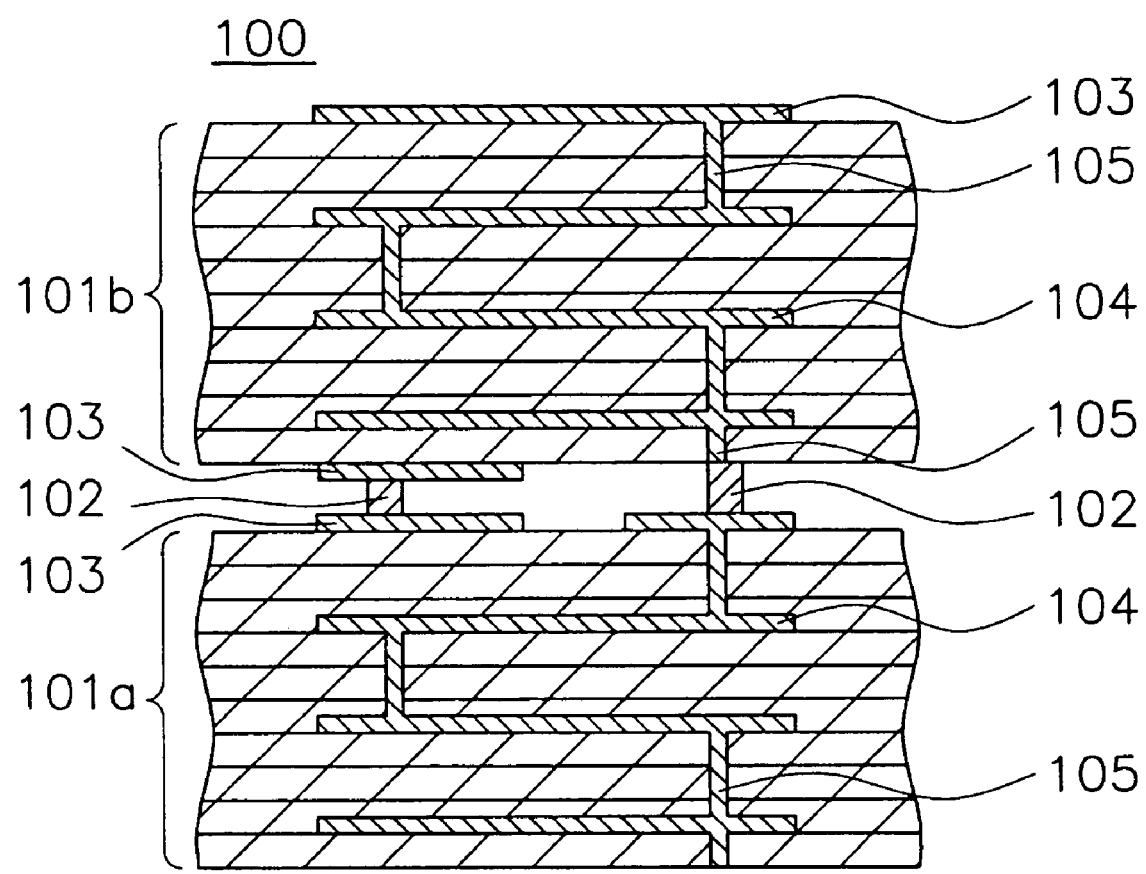
FIG. 1 is a schematic cross-sectional view of a ceramic structure according to a first preferred embodiment of the present invention.

FIG. 1 is a schematic cross-sectional view showing a ceramic structure according to a first preferred embodiment of the present invention.

As shown in FIG. 1, a ceramic structure 100 includes ceramic sintered bodies 101a and 101b which are laminated to each other with connecting members 102 interposed therebetween so that a predetermined space is present between the ceramic sintered bodies.

In this preferred embodiment, the ceramic sintered bodies 101a and 101b are ceramic multilayer substrates each including a plurality of ceramic layers and may function as a multilayer capacitor or a chip resistor. Conductors 103 are provided on the surfaces of the ceramic sintered bodies 101a and 101b, and between the ceramic layers of the ceramic sintered bodies 101a and 101b, internal conductors 104 and via conductors 105 connecting the internal conductors 104 are provided.

The connecting members 102 are each preferably a pillar-shaped connecting member made of a sintered metal, for example. The sintered metal is a metal formed by firing a conductive paste containing Ag or other suitable material when ceramic is fired. The connecting members 102 electrically and mechanically connect the conductor 103 provided on the surface of the ceramic sintered body 101a to the conductor 103 located on the surface of the ceramic sintered body 101b. In this preferred embodiment, the connecting member 102 may connect the via conductor 105 exposed at the surface of the ceramic sintered body 101a to the via conductor 105 exposed at the surface of the ceramic sintered body 101b. Since the connecting member 102 is directly connected to the conductors 103, solder is not provided therebetween.

Figure 2:
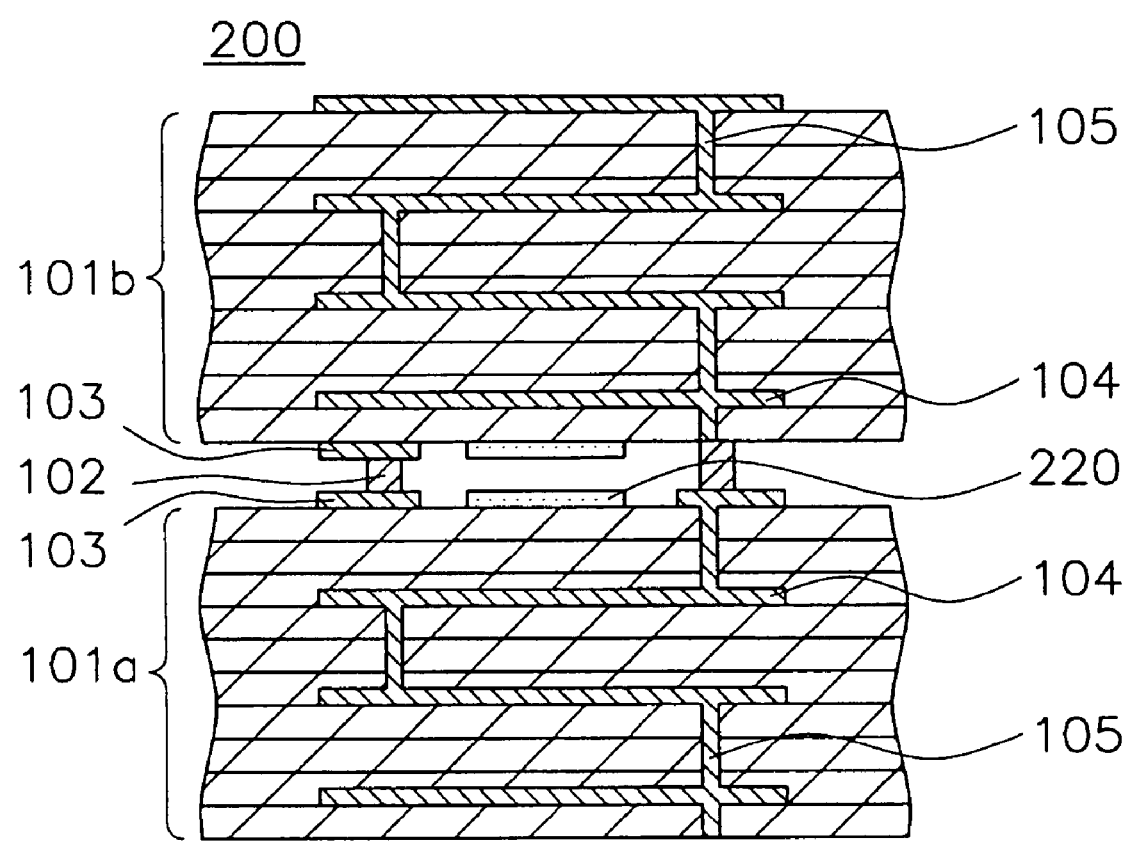
FIG. 2 is a schematic cross-sectional view of a ceramic structure of a modified example according to the first preferred embodiment of the present invention.

FIG. 2 is a schematic cross-sectional view showing a ceramic structure of a modified example according to this preferred embodiment.

As shown in FIG. 2, a ceramic structure 200 is composed of the ceramic sintered bodies 101a and 101b which are laminated to each other with the connecting members 102 interposed therebetween so that a predetermined space is present between the ceramic sintered bodies.

In this preferred embodiment, the ceramic sintered bodies 101a and 101b are ceramic multilayer substrates each including a plurality of ceramic layers and may function as a multilayer capacitor or a chip resistor. The conductors 103 are provided on the surfaces of the ceramic sintered bodies 101a and 101b, and between the ceramic layers of the ceramic sintered bodies 101a and 101b, the internal conductors 104 and the via conductors 105 connecting the internal conductors 104 are provided. On one of the major surfaces of the ceramic sintered body 101a and on one of the major surfaces of the ceramic sintered body 101b, thick film resistors 220 are provided.

The connecting state between the ceramic sintered body 101a and the ceramic sintered body 101b is preferably the same as that of the ceramic structure 100.

Figure 3:
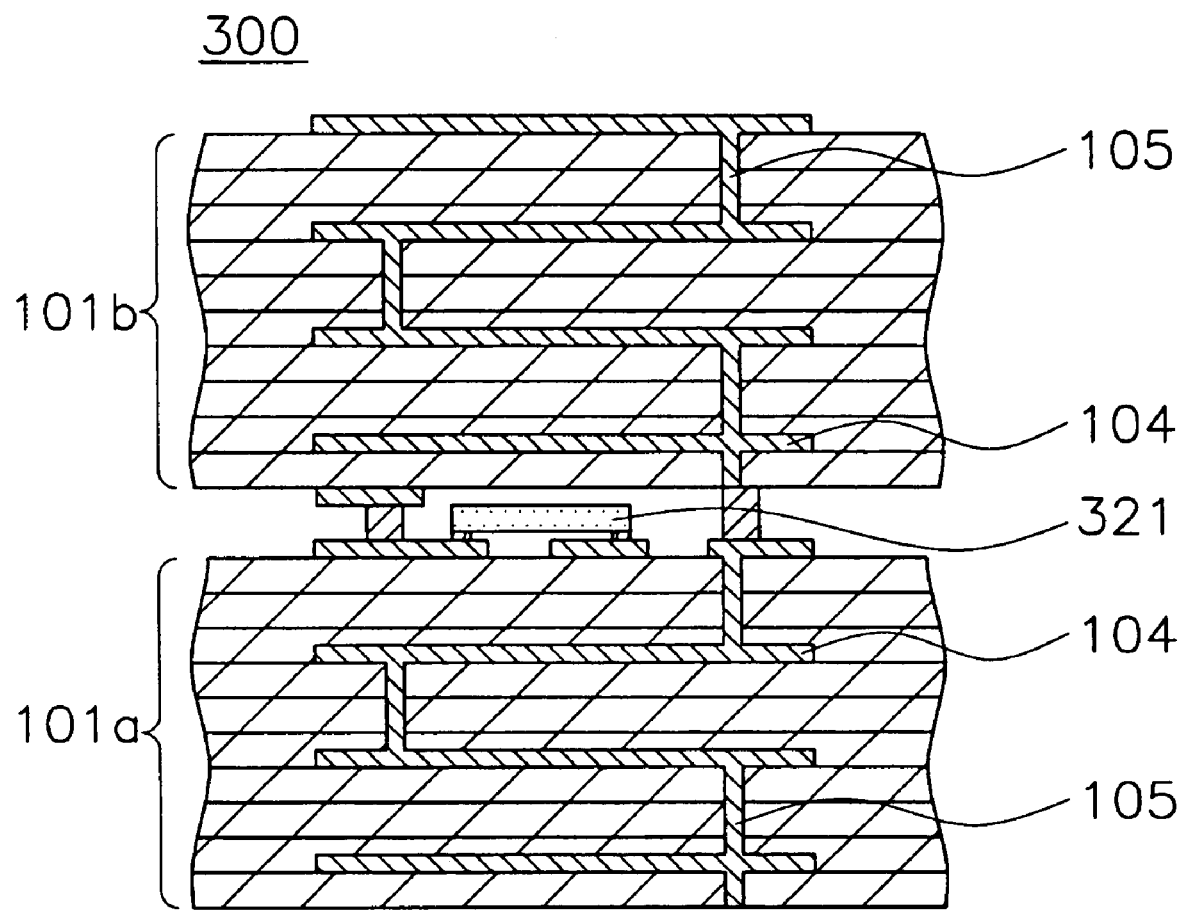
FIG. 3 is a schematic cross-sectional view of a ceramic structure of another modified example according to the first preferred embodiment of the present invention.

FIG. 3 is a schematic cross-sectional view showing a ceramic structure of a modified example according to this preferred embodiment.

As shown in FIG. 3, a ceramic structure 300 includes the ceramic sintered bodies 101a and 101b which are laminated to each other with the connecting members 102 interposed therebetween so that a predetermined space is present between the ceramic sintered bodies, and on one of the major surfaces of the ceramic sintered body 101a, an electronic component 321 is mounted.

The structures of the ceramic sintered bodies 101a and 101b and the connecting state therebetween are preferably the same as that of the ceramic structure 100.

Since the ceramic structure of this preferred embodiment has the pillar-shaped connecting members, the accuracy of bonding pitch therebetween can be improved, and in addition, when an electronic component is mounted onto the ceramic sintered body, fine and accurate mounting of the component can be performed.

In addition, since connecting member-forming ceramic green sheets are removed after firing, the exterior surface area of the ceramic substrate is increased, and as a result, heat dissipation properties of the ceramic substrate can be improved.

Furthermore, when the connecting member is made of a sintered metal containing Ag or other suitable material, the conduction resistance between the ceramic substrates can be decreased as compared to that obtained when solder is used for the connection therebetween.

The ceramic structure 100 can be formed, for example, by the following method.

Figure 4:
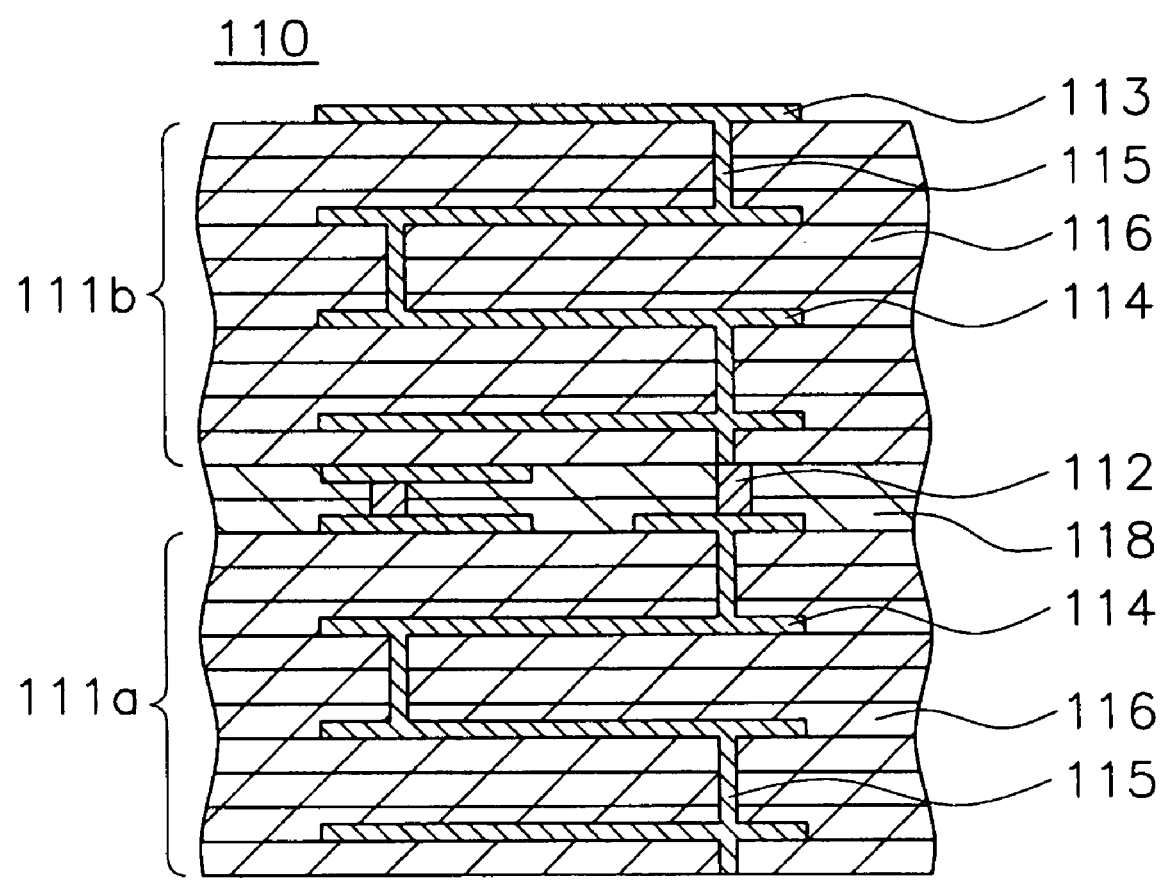
FIG. 4 is a schematic cross-sectional view of the ceramic structure in process according to the first preferred embodiment of the present invention for illustrating a manufacturing method thereof.

FIG. 4 is a schematic cross-sectional view of the ceramic structure in process of this preferred embodiment for illustrating a manufacturing method thereof.

First, substrate-forming ceramic green sheets and connecting member-forming ceramic green sheets are prepared.

The substrate-forming ceramic green sheets can be formed by the steps of mixing a powdered ceramic, a binder, a plasticizer, a solvent, a dispersing agent, and the like using a ball mill, an attractor, or the like to form a slurry, defoaming the slurry, and forming the substrate-forming green sheets using a doctor blade method or other suitable process.

As the powdered ceramic, for example, there may be used a crystallized glass such as a powdered $CaO$—$Al_2O_3$—$SiO_2$-based glass or a powdered $MgO$—$Al_2O_3$—$SiO_2$-based glass, or a mixture of the aforementioned powdered glass and ceramic filler such as alumina, zircon, mullite, cordierite, anorthite, or silica. In addition, as the binder, for example, polyvinyl butyral, methacrylic polymer, and acrylic polymer may be used. As the plasticizer, for example, phallic acid derivatives may be used. As the solvent, for example, alcohols, ketones, and chlorinated organic solvents may be used. As the dispersing agent, for example, polyoxyethylene-based and polyoxyalkylene glycol-based dispersing agents may be used.

The connecting member-forming ceramic green sheet can be formed by the same method as that for the substrate-forming ceramic green sheet. However, the sintering temperature thereof is higher than that of the substrate-forming ceramic green sheet. For example, when a material having a sintering temperature of about 1,100° C. or less is used for the substrate-forming ceramic green sheet, as a powdered ceramic contained in the connecting member-forming ceramic green sheet, for example, there may be used powdered alumina, zirconia, aluminum nitride, boron nitride, mullite, magnesium oxide, or silicon carbide.

Next, a conductive paste containing a powdered metal such as Ag, Cu, Au, Ag—Pd, or Ag—Pt is filled in via holes provided in the substrate-forming ceramic green sheets and the connecting member-forming ceramic green sheets, so that via conductors are formed. Subsequently, the conductive paste is screen-printed on predetermined positions of the substrate-forming ceramic green sheets, thereby forming the conductors. The melting point of the metal contained in the conductive paste is higher than the sintering temperature of ceramic molded bodies for forming the ceramic sintered bodies.

Next, as shown in FIG. 4, substrate-forming ceramic green sheets 116 having conductors 113, internal conductors 114, and via conductors 115 are disposed so as to sandwich connecting member-forming ceramic green sheets 118 having via conductors 112, followed by lamination and bonding thereof by pressure application. As a result, a composite laminate 110 is obtained which includes the connecting member-forming ceramic green sheets 118 provided between ceramic molded bodies 111a and 111b, each being a laminate of the substrate-forming ceramic green sheets 116.

In order to form the composite laminate 110, it is preferable that the pressure for laminating and bonding the ceramic molded bodies 111a and the 111b be about 50 MPa or more and the temperature therefor be about 40° C. to about 90° C., for example.

Next, the composite laminate 110 is fired at a temperature at which the ceramic green sheets 116 are sintered and the ceramic green sheets 118 are not sintered and at a temperature not more than the melting point of the metal. By the firing performed at the temperature described above, when the ceramic green sheets 116 are sintered, the ceramic green sheets 118 prevent and minimize shrinkage of the ceramic green sheets 116. In addition, when the firing temperature is more than the sintering temperature of the ceramic green sheets 116, the ceramic green sheets 116 prevent and minimize shrinkage of the ceramic green sheets 118, and hence the shrinkage of the composite laminate 110 is reliably prevented.

Next, the ceramic green sheets 118 are removed from the fired composite laminate. Accordingly, the via conductors 112 formed in the ceramic green sheets 118 become the connecting members 102 which are previously shown in FIG. 1, thereby forming the ceramic structure 100.

In addition, the ceramic structure 200 can be formed, for example, by the following method.

Figure 5:
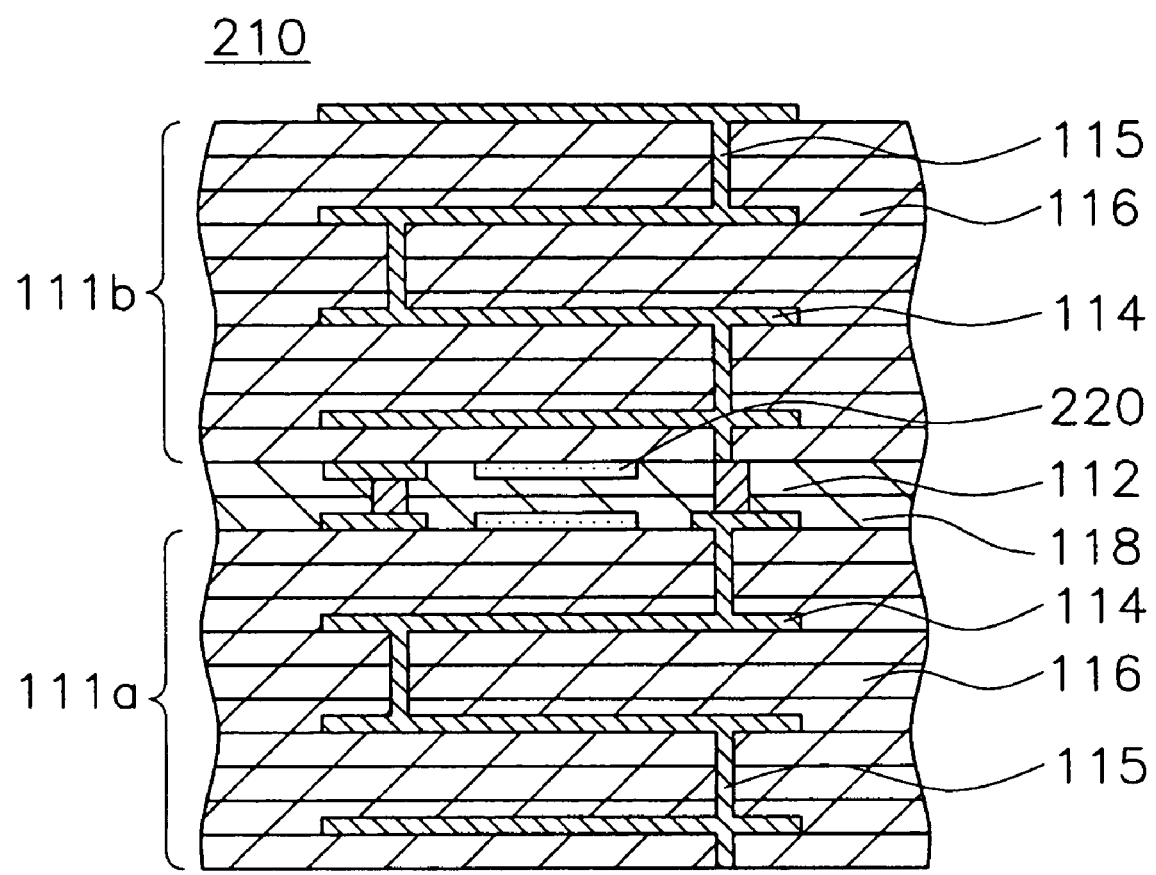
FIG. 5 is a schematic cross-sectional view of a ceramic structure in process of a modified example according to the first preferred embodiment of the present invention for illustrating a manufacturing method thereof.

FIG. 5 is a schematic cross-sectional view of a ceramic structure in process of a modified example according to this preferred embodiment for illustrating a manufacturing method thereof.

First, the same substrate-forming ceramic green sheets, connecting member-forming ceramic green sheets and conductive paste as those of the case of forming the ceramic structure 100 are prepared.

Next, the conductive paste is filled in the via holes provided in the substrate-forming ceramic green sheets and the connecting member-forming ceramic green sheets, so that the via conductors are formed. Subsequently, the conductive paste is screen-printed on predetermined positions of the substrate-forming ceramic green sheets, thereby forming the conductors. The melting point of the metal contained in the conductive paste is higher than the sintering temperature of the ceramic molded bodies. In addition, a resistive paste is screen-printed on predetermined positions of the substrate-forming ceramic green sheets, thereby forming thick-film resistors.

Next, as shown in FIG. 5, the ceramic green sheets 116 having the conductors 113, the internal conductors 114, the via conductors 115, and thick-film resistors 220 are disposed so as to sandwich the ceramic green sheets 118 having the via conductors 112, followed by lamination and bonding thereof by pressure application. In this case, the substrate-forming ceramic green sheets 116 provided with the thick-film resistors 220 are disposed so as to be brought into contact with the connecting member-forming ceramic green sheets 118. As a result, a composite laminate 210 is obtained which includes the connecting member-forming ceramic green sheets 118 provided between the ceramic molded bodies 111a and 111b each being a laminate of the substrate-forming ceramic green sheets 116.

In order to form the composite laminate 210, it is preferable that the pressure for laminating and bonding the ceramic molded bodies 111a and the 111b be about 50 MPa or more and the temperature therefor be about 40° C. to about 90° C., for example.

Next, the composite laminate 210 is fired under the same conditions as that for the composite laminate 110, and the ceramic green sheets 118 are removed, thereby forming the ceramic structure 200 shown in FIG. 2.

Figure 6:
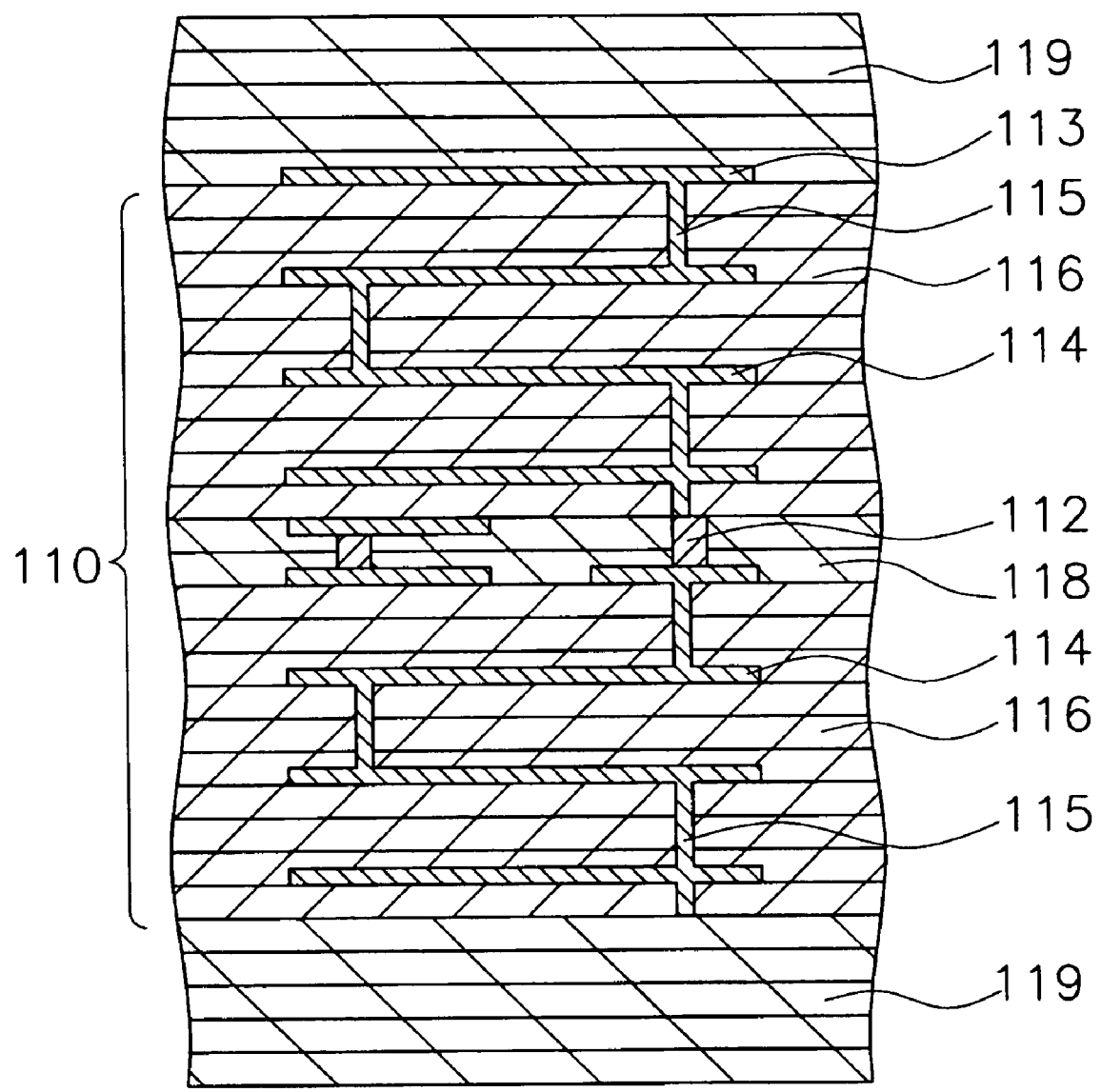
FIG. 6 is a schematic cross-sectional view of a ceramic structure in process of another modified example according to the first preferred embodiment of the present invention for illustrating a manufacturing method thereof.
Figure 7:
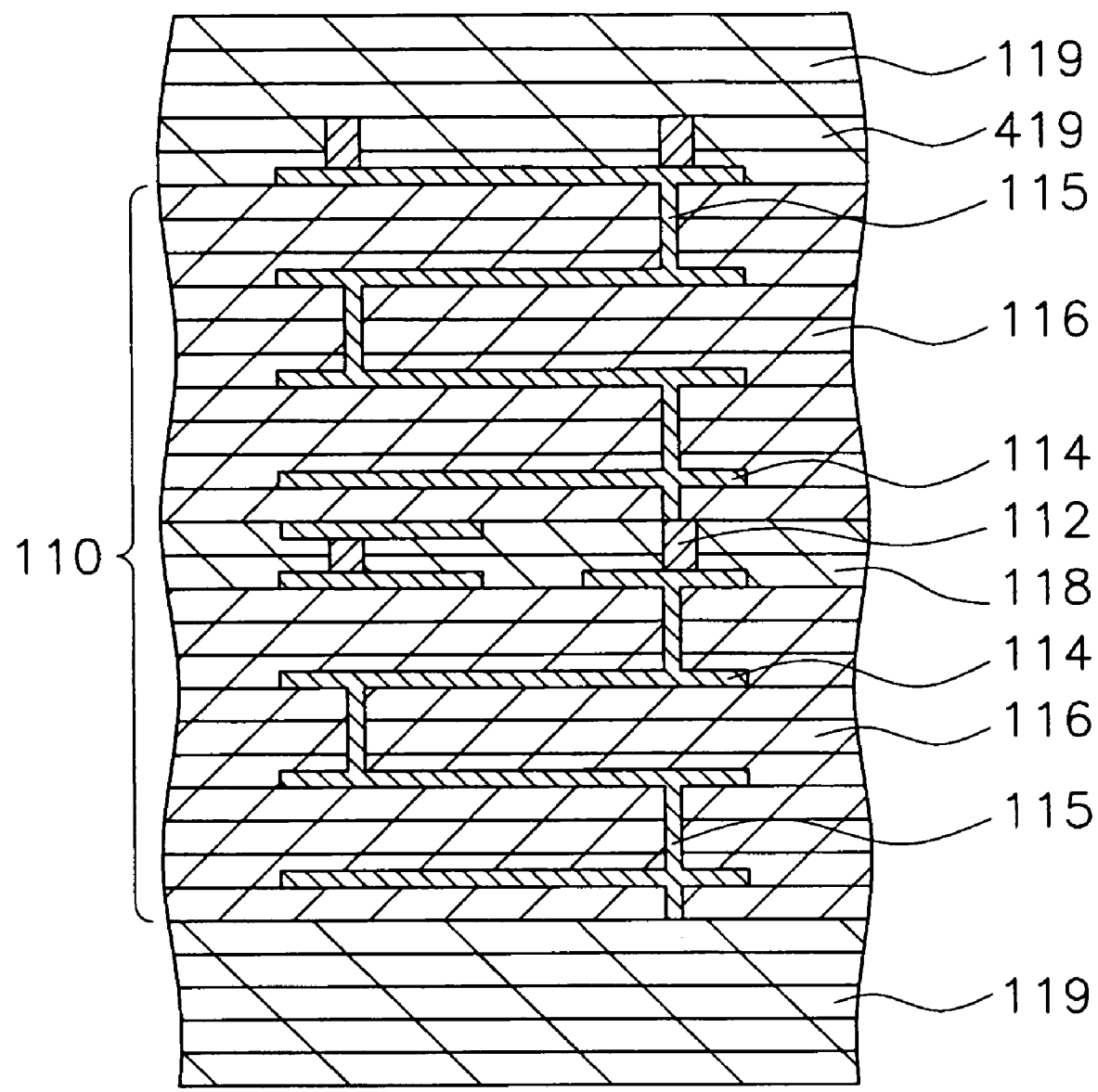
FIG. 7 is a schematic cross-sectional view of a ceramic structure in process of another modified example according to the first preferred embodiment of the present invention for illustrating a manufacturing method thereof.
Figure 8:
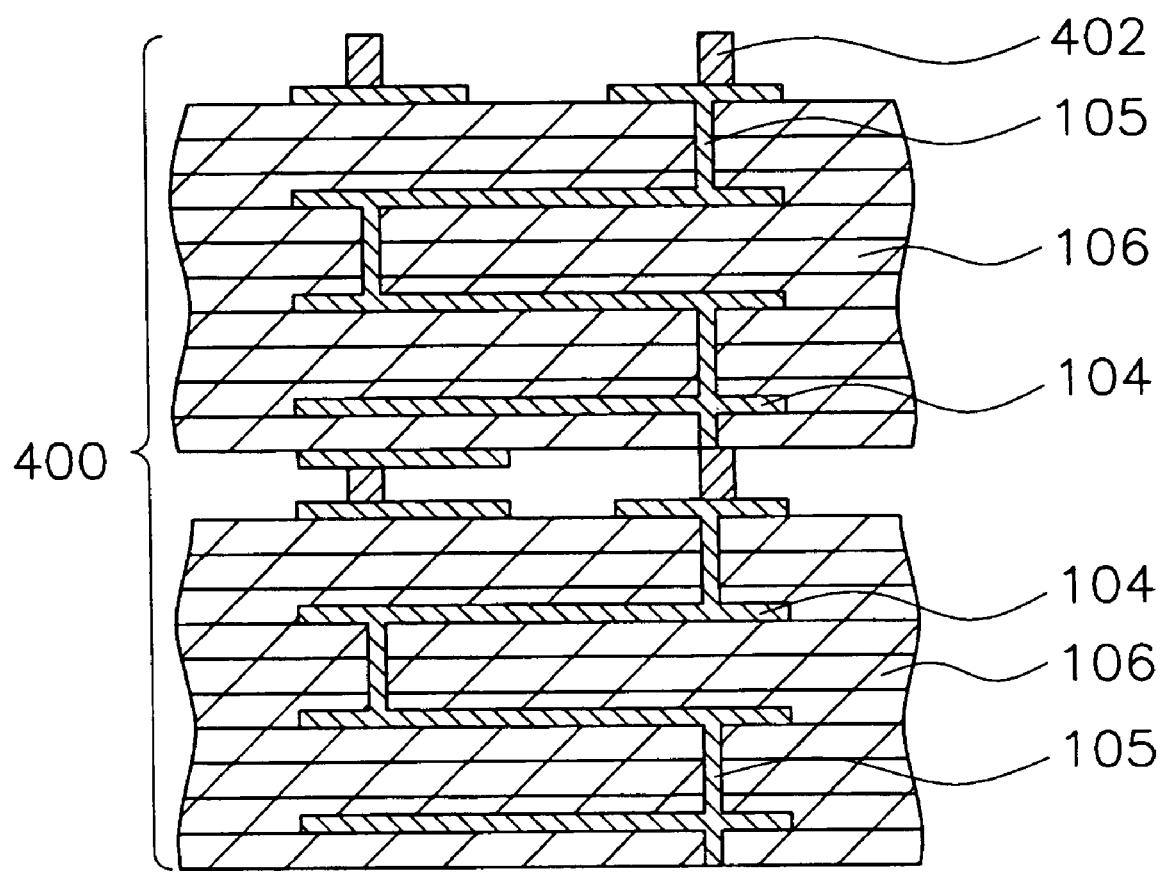
FIG. 8 is a schematic cross-sectional view of a ceramic structure of another modified example according to the first preferred embodiment of the present invention.

Hereinafter, other methods for manufacturing the ceramic structure 100 will be described. FIGS. 6 and 7 are schematic cross-sectional views each showing a ceramic structure in process of a modified example according to this preferred embodiment for illustrating a manufacturing method thereof. FIG. 8 is a schematic cross-sectional view of a ceramic structure of a modified example according to this preferred embodiment.

First, substrate-forming ceramic green sheets and connecting member-forming ceramic green sheets are prepared in the same manner as that of the method for forming the ceramic structure 100 described above. Next, by using the same material as that for the connecting member-forming ceramic green sheet and the same method as described above, shrinkage-suppression ceramic green sheets are formed. The shrinkage-suppression ceramic green sheet and the connecting member-forming ceramic green sheet may be formed from different materials.

Next, as shown in FIG. 6, the substrate-forming ceramic green sheets 116 having the conductors 113, the internal conductors 114, and the via conductors 115 are disposed so as to sandwich the connecting member-forming ceramic green sheets 118 having the via conductors 112 to form a laminate, and shrinkage-suppression ceramic green sheets 119 are provided on two sides of laminate thus formed, followed by lamination and bonding thereof by pressure application. As a result, the composite laminate 110 provided with the shrinkage-suppression ceramic green sheets 119 is obtained.

Subsequently, the composite laminate 110 provided with the ceramic green sheets 119 is fired at a temperature at which the ceramic green sheets 116 are sintered and the ceramic green sheets 118 and the ceramic green sheets 119 are not sintered and at a temperature not more than the melting point of the metal. After the firing, when the ceramic green sheets 118 are removed, the ceramic green sheets 119 are also removed, thereby forming the ceramic structure 110 shown in FIG. 1.

Next, as shown in FIG. 7, a shrinkage-suppression ceramic green sheet 419 having via conductors is provided between the substrate-forming ceramic green sheet 116 and the shrinkage-suppression ceramic green sheet 119, followed by lamination and bonding thereof by pressure application. As a result, the composite laminate 110 provided with the ceramic green sheets 119 and the shrinkage-suppression ceramic green sheet 419 having the via conductors is obtained.

The composite laminate 110 provided with the ceramic green sheets 119 and the ceramic green sheet 419 having the via conductors is fired at a temperature at which the ceramic green sheets 116 are sintered and the ceramic green sheets 118, 119, and 419 are not sintered and at a temperature not more than the melting point of the metal. After the firing, when the ceramic green sheets 118 are removed, the ceramic green sheets 119 and the ceramic green sheet 419 are also removed, thereby forming a ceramic structure 400 shown in FIG. 8.

On connecting members 402 of the ceramic structure 400, an electronic component can be mounted.

According to the method for manufacturing the ceramic structure of this preferred embodiment, in the case in which a ceramic structure including ceramic sintered bodies laminated to each other is formed, the ceramic sintered bodies to be formed by firing can be easily placed at proper positions since the positioning thereof can be performed when ceramic green sheets forming the ceramic sintered bodies are laminated to each other.

In addition, since the ceramic molded bodies are not required to be separately fired but can be simultaneously fired, a mounting step is not required, and as a result, the cost can be reduced.

Since the connecting member is preferably a pillar-shaped sintered metal formed by sintering the via conductor formed in the connecting member-forming ceramic green sheet, the connecting member can be formed as it is designed.

In addition, in the space between the ceramic sintered bodies, a thick-film resistor may be provided or an electronic component may be mounted.

Furthermore, by the use of the shrinkage-suppression ceramic green sheets, the shrinkage of the composite laminate which occurs in firing can be prevented and minimized, and as a result, a ceramic structure having no warp and/or strain can be formed.

As for the ceramic structure having the connecting members at the topmost position thereof, an electronic component can be easily mounted on the connecting members.

Figure 9:
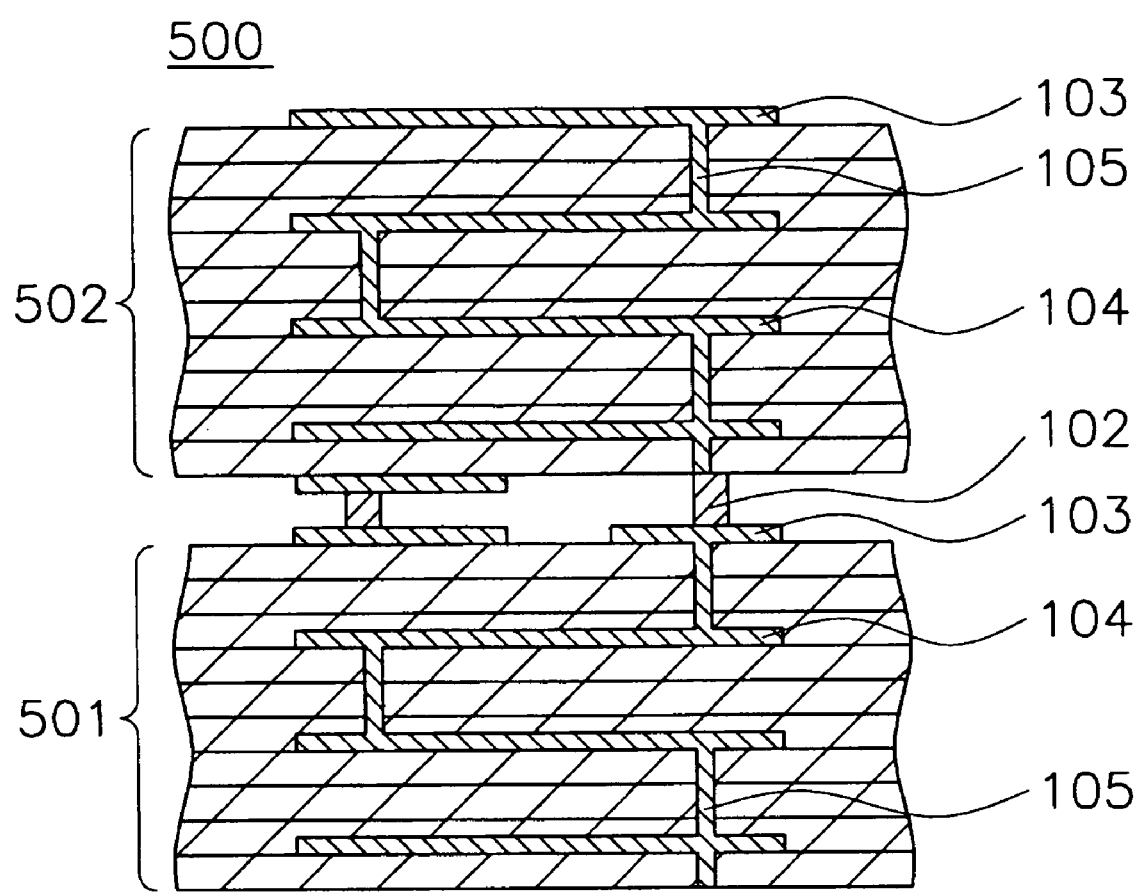
FIG. 9 is a schematic cross-sectional view of a ceramic structure according to a second preferred embodiment of the present invention.
Figure 10:
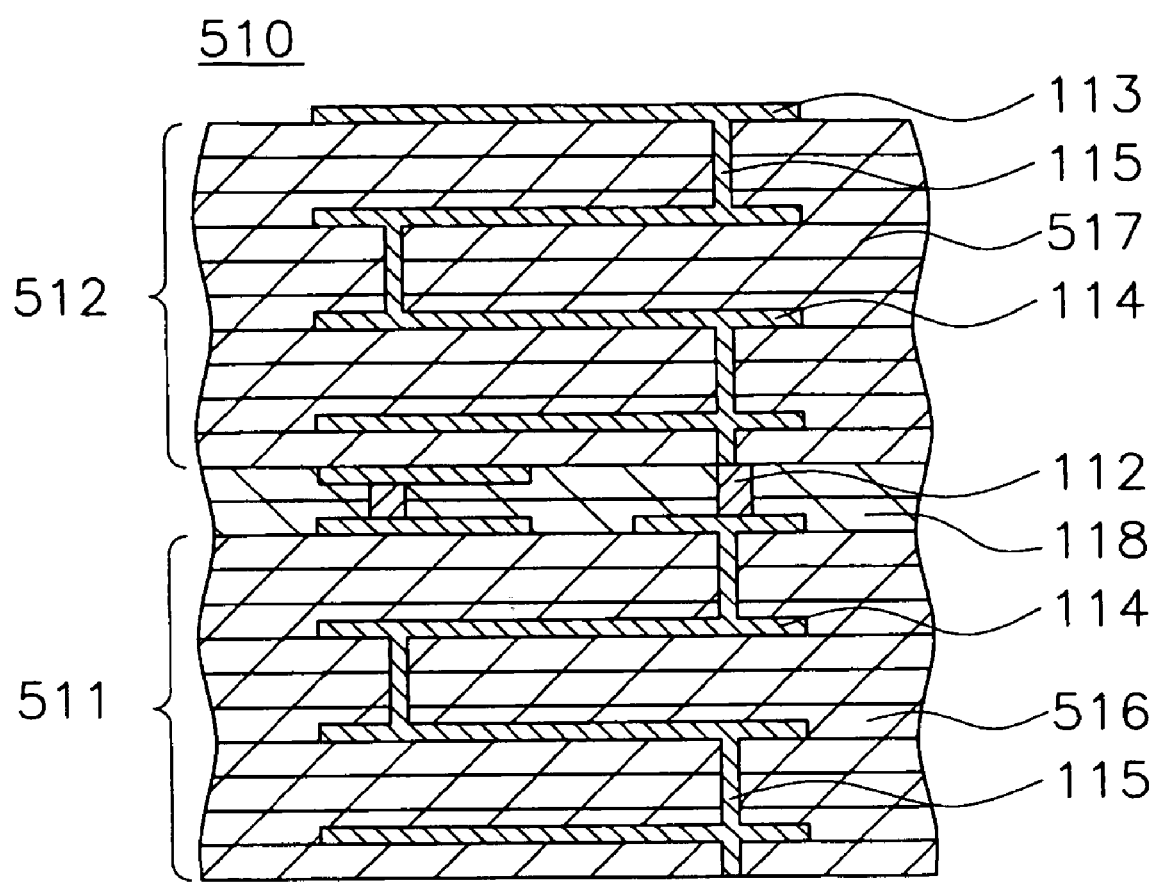
FIG. 10 is a schematic cross-sectional view of the ceramic structure in process according to the second preferred embodiment of the present invention for illustrating a manufacturing method thereof.

FIG. 9 is a schematic cross-sectional view showing a ceramic structure of a second preferred embodiment of the present invention. FIG. 10 is a schematic cross-sectional view of the ceramic structure in process of the second preferred embodiment for illustrating a manufacturing method thereof.

As shown in FIG. 9, a ceramic structure 500 is a ceramic multilayer substrate including a first ceramic sintered body 501 and a second ceramic sintered body 502, which are formed from different ceramic layers. The structures of the ceramic sintered bodies 501 and 502 and the connecting state therebetween are preferably the same as that of the first preferred embodiment of the present invention.

First, in the same manner as that shown in the first preferred embodiment of the present invention, first substrate-forming ceramic green sheets, second substrate-forming ceramic green sheets which are formed of a material different from that for the first substrate-forming ceramic green sheets, and connecting member-forming ceramic green sheets are prepared.

Next, as shown in FIG. 10, first substrate-forming ceramic green sheets 516 having the conductors 113, the internal conductors 114, and the via conductors 115 and second substrate-forming ceramic green sheets 517 having the conductors 113, the internal conductors 114, and the via conductors 115 are disposed so as to sandwich the connecting member-forming ceramic green sheets 118 having the via conductors 112, followed by lamination and bonding thereof by pressure application. As a result, a composite laminate 510 is obtained which includes the connecting member-forming ceramic green sheets 118 provided between ceramic molded bodies 511 and 512 which are laminates including the first substrate-forming ceramic green sheets 516 and the second substrate-forming ceramic green sheets 517, respectively.

Next, in order to form the composite laminate 510, the pressure applied to the ceramic molded bodies 511 and 512 for lamination and bonding thereof is preferably about 50 MPa or more, and the temperature therefor is preferably in the range of about 40° C. to about 90° C., for example.

Next, by the same method as that shown in the first preferred embodiment of the present invention, firing is performed, and the connecting member-forming ceramic green sheets 118 are removed, thereby forming the ceramic structure 500 shown in FIG. 9.

In the case in which ceramic sintered bodies made of different ceramic materials are laminated with no connecting member-forming ceramic green sheets interposed therebetween and are then simultaneously fired, due to the difference in shrinkage behavior, warp and/or strain may be generated, and as a result, a space may be formed between the ceramic sintered bodies. However, according to the manufacturing method of the ceramic structure of preferred embodiments of the present invention, by the presence of the connecting member-forming ceramic green sheets, the warp and/or strain generated in the ceramic sintered bodies can be prevented and minimized, and the displacement between the ceramic sintered bodies can be prevented and minimized.

Figure 11:
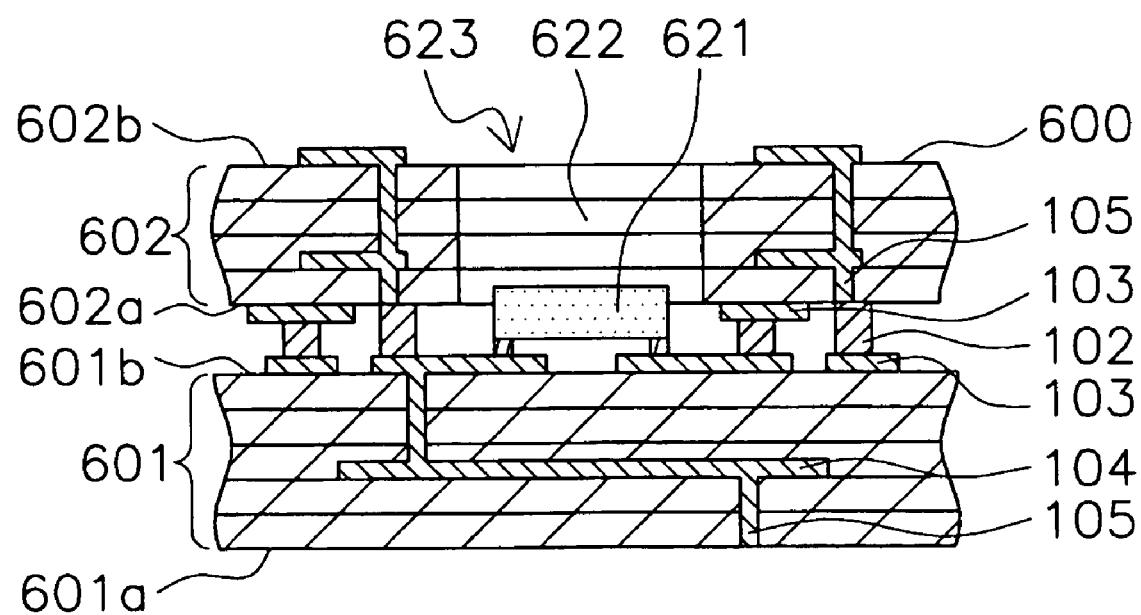
FIG. 11 is a schematic cross-sectional view of a ceramic structure according to a third preferred embodiment of the present invention.
Figure 12:
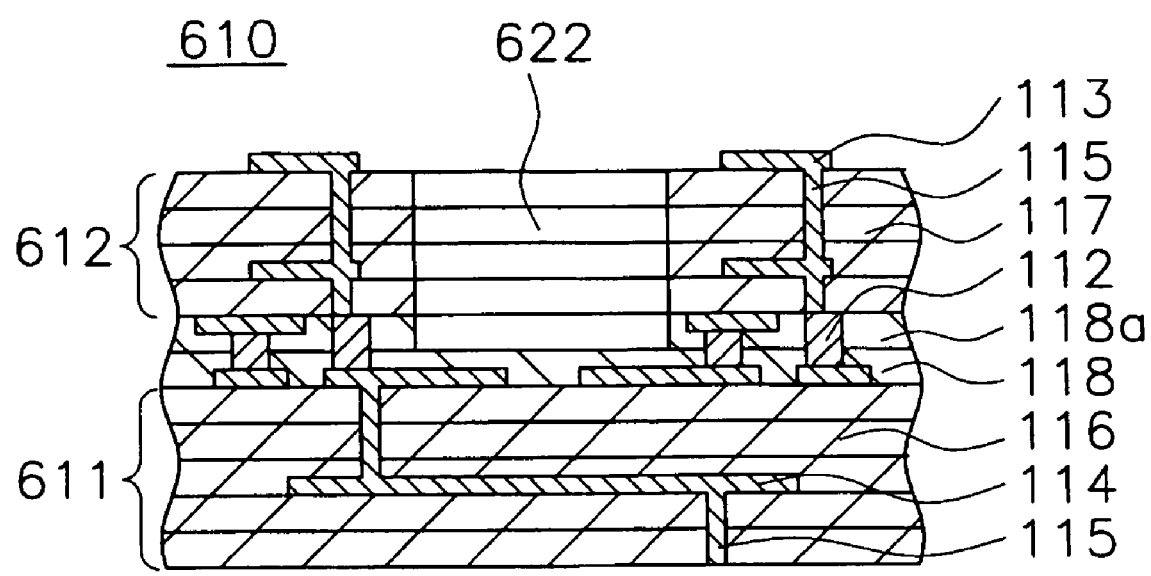
FIG. 12 is a schematic cross-sectional view of the ceramic structure in process according to the third preferred embodiment of the present invention for illustrating a manufacturing method thereof.

FIG. 11 is a schematic cross-sectional view showing a ceramic structure according to the present preferred embodiment. FIG. 12 is a cross-sectional view of the ceramic structure in process according to the present preferred embodiment for illustrating a manufacturing method thereof.

As shown in FIG. 11, a ceramic structure 600 includes a first ceramic sintered body 601 and a second ceramic sintered body 602 laminated to each other with the connecting members 102 interposed therebetween so that a predetermined space is present between the sintered bodies. The second ceramic sintered body 602 is a frame-shaped ceramic substrate having a through-hole 622 penetrating from one major surface 602a to the other major surface 602b and is provided with the conductors 103 on the major surface 602a. The first ceramic sintered body 601 is a ceramic substrate having the conductors 103 on one major surface 601b. Between ceramic layers of the first and the second sintered bodies 601 and 602, the internal conductors 104 are provided, and in addition, the via conductors 105 connecting the internal conductors 104 are provided.

The structures of the ceramic sintered bodies 601 and 602 and the connecting state therebetween are preferably the same as that in the first preferred embodiment of the present invention.

The ceramic structure 600 has a recess portion 623 formed by the major surface 601b of the first ceramic sintered body 601 used as the bottom surface and the through-hole 622 of the second sintered body 602 used as the side surfaces. By using the recess portion 623, an electronic component 621 can be mounted. As a result, a circuit module can be miniaturized, and the height thereof can be reduced.

The ceramic structure 600 can be formed, for example, by the following method.

First, by the same method as that of the first preferred embodiment, first substrate-forming ceramic green sheets, second substrate-forming ceramic green sheets, and connecting member-forming ceramic green sheets are prepared.

Next, as shown in FIG. 12, the connecting member-forming ceramic green sheet 118 having the via conductors 112 and first substrate-forming ceramic green sheets 116 having the conductors 113, the internal conductor 114, and the via conductors 115 are laminated to each other to form a first ceramic molded body 611 provided with the connecting member-forming ceramic green sheet 118. Subsequently, the connecting member-forming ceramic green sheet 118 having the via conductors 112 and second substrate-forming ceramic green sheets 117 having the conductors 113, the internal conductors 114, and the via conductors 115 are laminated to each other, and the through-hole 622 is formed in the laminate thus formed in the thickness direction, thereby forming a second ceramic molded body having the through-hole 622 and provided with a connecting member-forming ceramic green sheet 118*a*. Next, the first ceramic molded body 611 and the second ceramic molded body 612 are disposed so as to sandwich the connecting member-forming ceramic green sheets 118 and 118*a*, followed by lamination and bonding thereof by pressure application. Accordingly, a composite laminate 610 is formed which includes the ceramic molded bodies 611 and 612 with the ceramic green sheets 118 and 118*a* interposed therebetween.

In order to form the composite laminate 610, it is preferable that the pressure for laminating and bonding the ceramic molded bodies 611 and 612 be about 50 MPa or more and the temperature thereof be about 40° C. to about 90° C., for example.

Subsequently, firing is performed in the same manner as that of the method shown in the first preferred embodiment of the present invention, and the ceramic green sheets 118 and 118*a* are removed, thereby forming the ceramic structure 600 shown in FIG. 11.

According to the manufacturing method of the ceramic structure of the present preferred embodiment, in the case in which a ceramic structure including ceramic sintered bodies laminated to each other and having a recess portion is formed, the ceramic sintered bodies to be formed by sintering can be easily placed at proper positions since the positioning thereof can be performed when ceramic green sheets forming the ceramic sintered bodies are laminated to each other.

In addition, since the ceramic molded bodies are not required to be separately fired but can be simultaneously fired, a mounting step is not necessary, and as a result, reduction in cost can be achieved.

Figure 13:
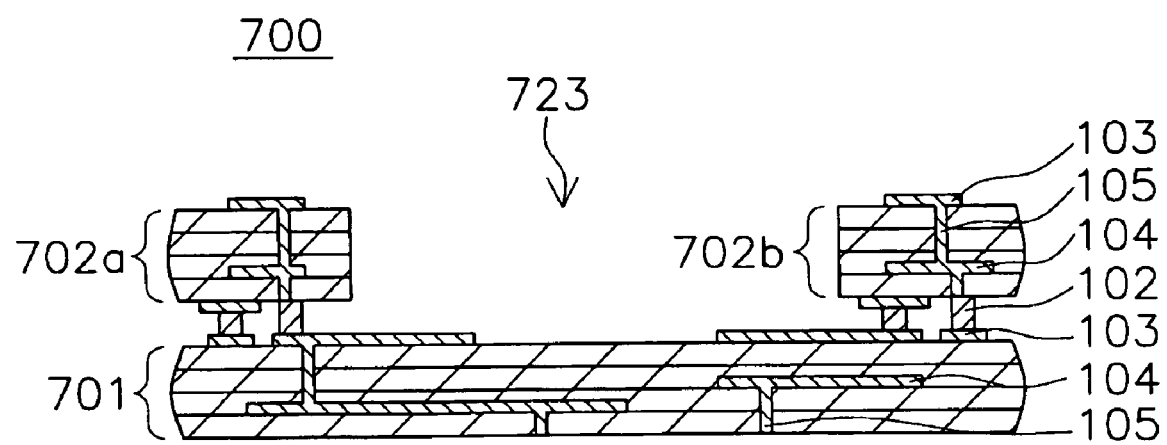
FIG. 13 is a schematic cross-sectional view of a ceramic structure according to a fourth preferred embodiment of the present invention.
Figure 14:
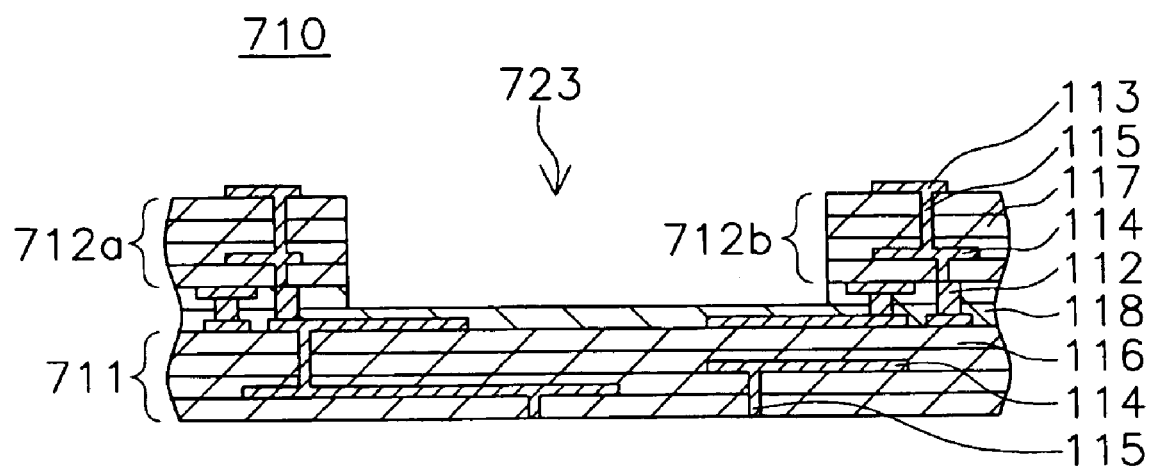
FIG. 14 is a schematic cross-sectional view of the ceramic structure in process according to the fourth preferred embodiment of the present invention for illustrating a manufacturing method thereof.

FIG. 13 is a schematic cross-sectional view showing a ceramic structure according to the present preferred embodiment. FIG. 14 is a schematic cross-sectional view of the ceramic structure in process according to the present preferred embodiment for illustrating a manufacturing method thereof.

As shown in FIG. 13, in a ceramic structure 700, a first ceramic sintered body 701 and a second ceramic sintered body 702*a* are laminated to each other with the connecting members 102 interposed therebetween so that a predetermined space is present between the ceramic sintered bodies, and the first ceramic sintered body 701 and a third ceramic sintered body 702*b* are laminated to each other with the connecting members 102 interposed therebetween so that a predetermined space is present between the ceramic sintered bodies. In addition, the second ceramic sintered body 702*a* and the third ceramic sintered body 702*b* are disposed above one major surface of the first ceramic sintered body 701 to face each other with a predetermined space provided therebetween. The one major surface of the first ceramic sintered body 701 and side surfaces of the second and the third ceramic sintered bodies 702*a* and 702*b* facing each other form a recess portion 723.

The structures of the ceramic sintered bodies 701, 702*a*, and 702*b*, the connecting state between the ceramic sintered bodies 701 and 702*a*, and the connecting state between the ceramic sintered bodies 701 and 702*b* are preferably the same as that in the first preferred embodiment.

The ceramic structure 700 can be formed, for example, by the following method.

First, by the same method as that of the first preferred embodiment, substrate-forming ceramic green sheets and connecting member-forming ceramic green sheets are prepared.

Next, as shown in FIG. 14, the connecting member-forming ceramic green sheet 118 having the via conductors 112 and the substrate-forming ceramic green sheets 116 having the conductors 113, the internal conductors 114, and the via conductors 115 are laminated to each other to define a first ceramic molded body 711 provided with the connecting member-forming ceramic green sheet 118. Next, the connecting member-forming ceramic green sheet 118 having the via conductors 112 and the substrate-forming ceramic green sheets 117 having the conductors 113, the internal conductors 114, and the via conductors 115 are laminated to each other to define a ceramic molded body provided with the connecting member-forming ceramic green sheet 118, and subsequently, this ceramic molded body thus formed is cut into parts each having a predetermined size, so that the ceramic molded bodies 712*a* and 712*b* are formed.

Next, the second and the third ceramic molded bodies 712*a* and 712*b* are disposed above the first ceramic molded body 711 with the connecting member-forming ceramic green sheets 118 interposed therebetween so that the second and the third ceramic molded bodies 712*a* and 712*b* face each other with a predetermined space therebetween, followed by lamination and bonding thereof by pressure application. One major surface of the first ceramic molded body 711 and the side surfaces of the second and the third ceramic molded bodies 712*a* and 712*b* facing each other form the recess portion 723. As a result, a composite laminate 710 is formed in which the second and the third ceramic molded bodies 712*a* and 712*b* are provided above the first ceramic molded body 711 with the connecting member-forming ceramic green sheets 118 interposed therebetween.

In order to form the composite laminate 710, it is preferable that the pressure for laminating and bonding the ceramic molded bodies 711, 712*a*, and 712*b* be about 50 MPa or more and the temperature thereof be about 40° C. to about 90° C.

Subsequently, firing is performed in the same manner as that of the method shown in the first preferred embodiment, and the ceramic green sheets 118 are removed, thereby forming the ceramic structure 700 shown in FIG. 13.

According to the manufacturing method of the ceramic structure of this preferred embodiment, in the case in which a ceramic structure including ceramic sintered bodies laminated to each other and having a recess portion is formed, the ceramic sintered bodies to be formed by sintering can be easily placed at proper positions since the positioning thereof can be performed when ceramic green sheets forming the ceramic sintered bodies are laminated to each other.

In addition, since the ceramic molded bodies are not required to be separately fired but can be simultaneously fired, a mounting step is not necessary, and as a result, a significant reduction in cost can be achieved.

In addition, since having the recess portion, the ceramic structure of this preferred embodiment can be effectively used for the following nonreciprocal circuit device.

Figure 15:
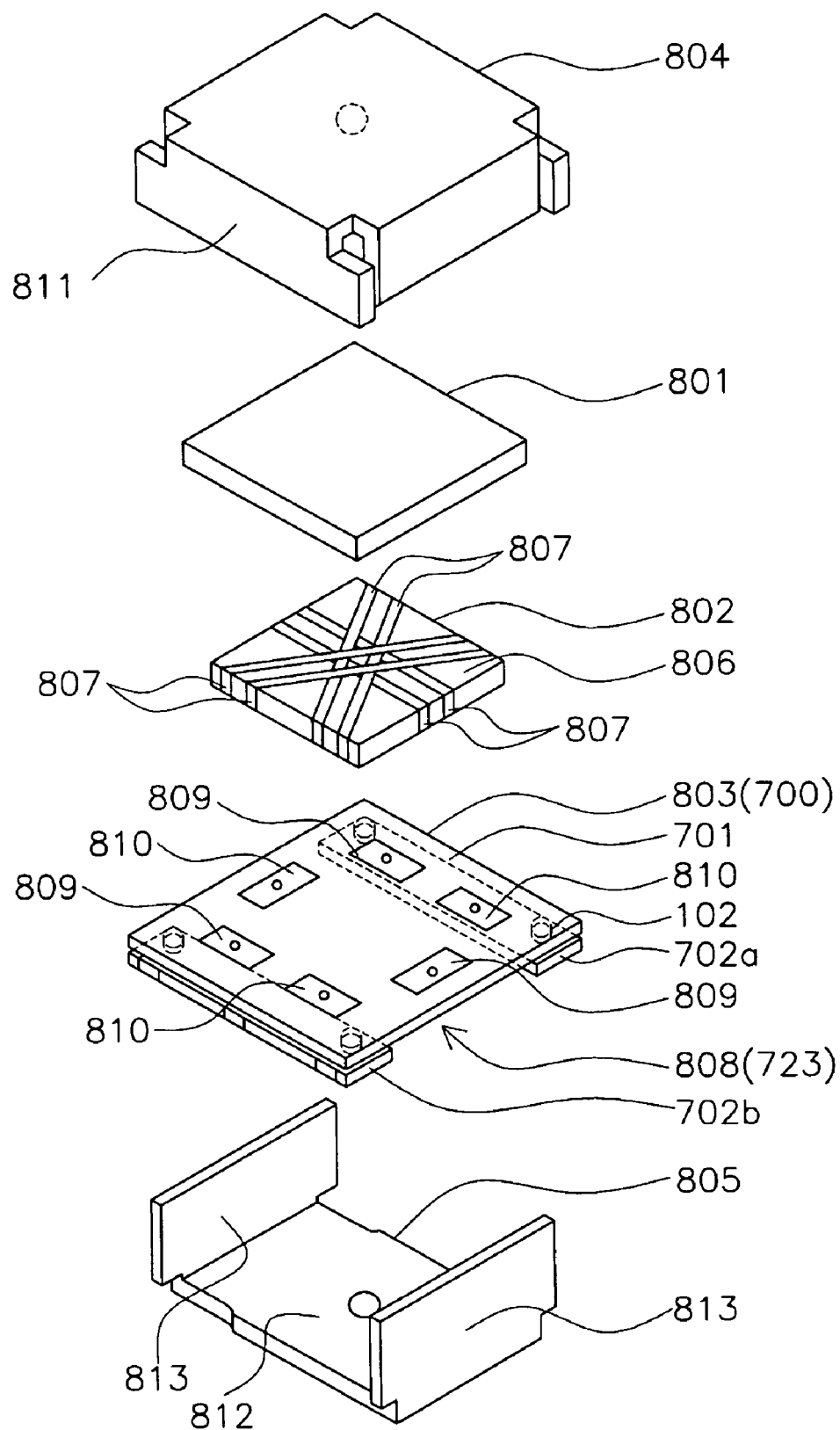
FIG. 15 is a schematic exploded view of a nonreciprocal circuit device using the ceramic structure according to the fourth preferred embodiment of the present invention.
Figure 16:
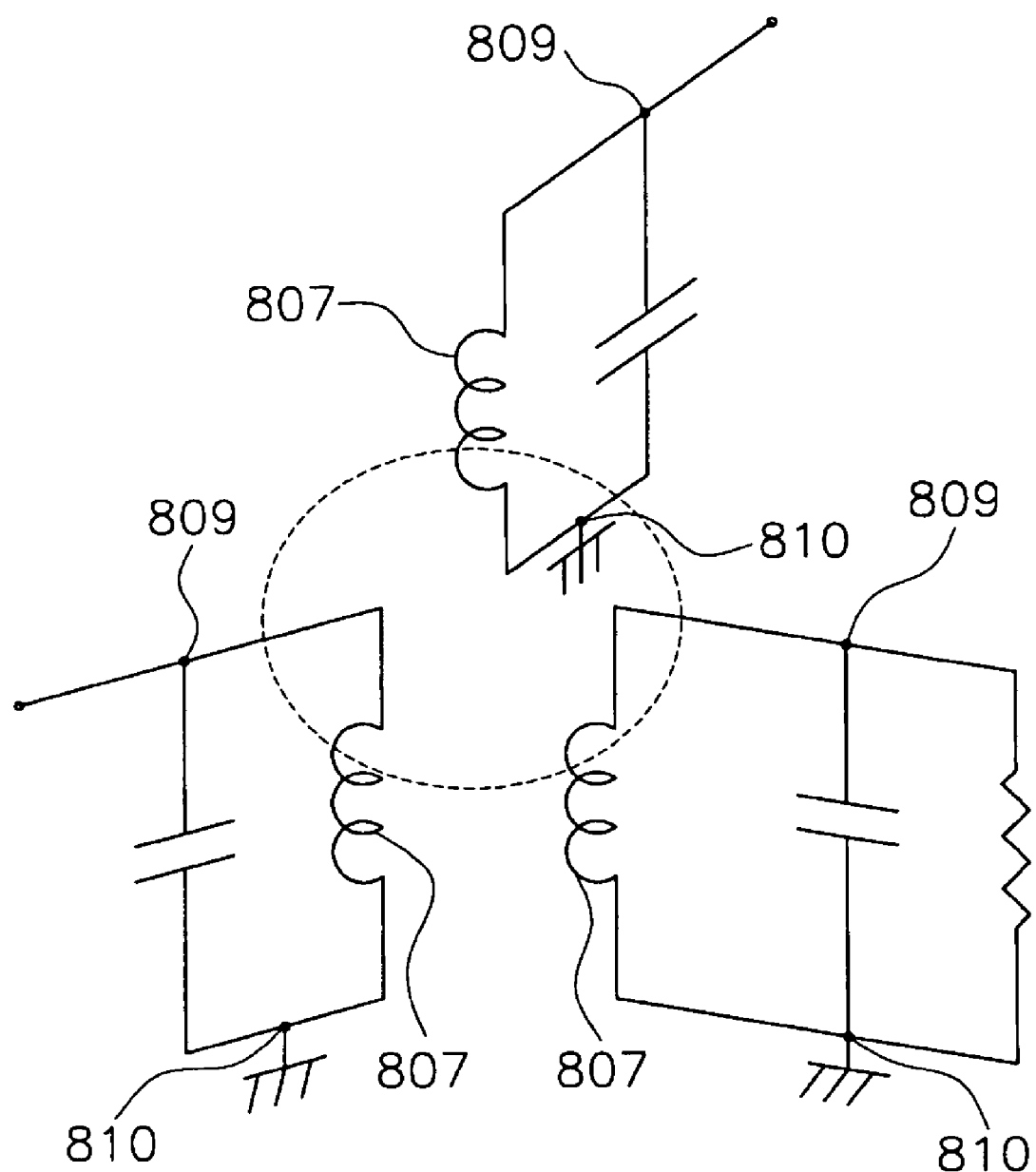
FIG. 16 is an electrical equivalent circuit diagram of the nonreciprocal circuit device using the ceramic structure according to the fourth preferred embodiment of the present invention.
Figure 17:
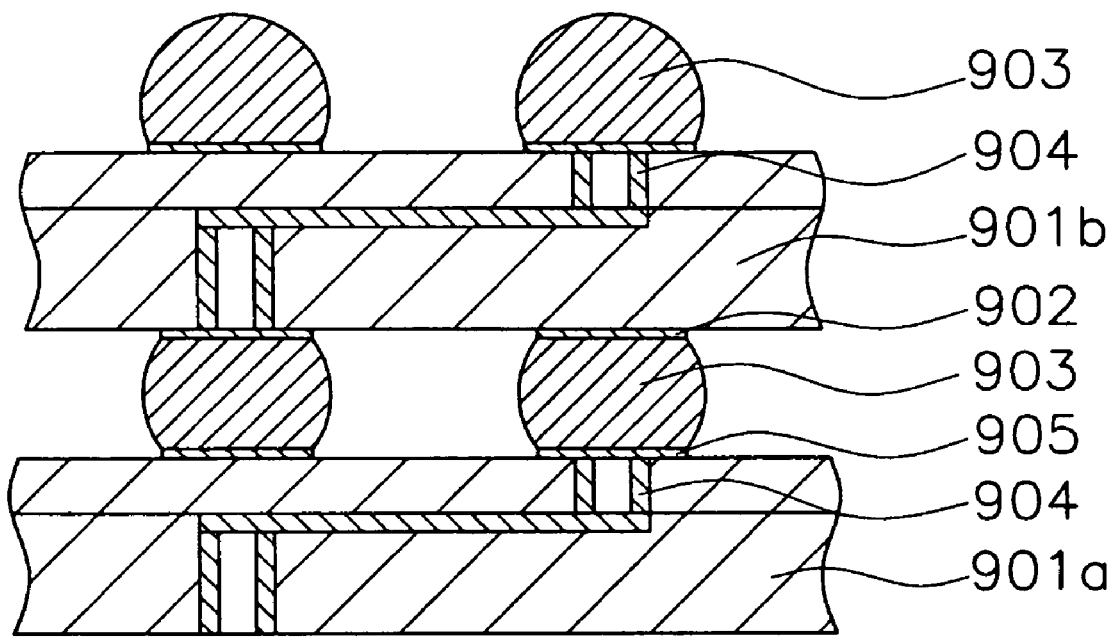
FIG. 17 is a schematic cross-sectional view of a related ceramic multilayer substrate.

FIG. 15 is an exploded schematic view of a nonreciprocal circuit device including a ceramic structure according to a preferred embodiment of the present invention. FIG. 16 is an electrical equivalent circuit diagram of a nonreciprocal circuit device including the ceramic structure of this preferred embodiment.

As shown in FIG. 15, the nonreciprocal circuit device preferably includes a permanent magnet 801, a central electrode assembly 802, a multilayer substrate 803, an upper yoke 804, and a lower yoke 805.

In the central electrode assembly 802, three central electrodes 807 are disposed on the upper surface of a substantially rectangular ferrite 806 with an insulating layer interposed therebetween so as to intersect each other at an angle of approximately 120°. A direct-current magnetic field is applied to the ferrite 806 by the permanent magnet 801.

As the multilayer substrate 803, as shown in FIG. 13, the ceramic structure 700 is used which is formed of the first, the second, and the third ceramic substrates 711, 712a, and 712b having the conductors on the surfaces thereof. The ceramic structure 700 has the recess portion 723 formed by one major surface of the first ceramic sintered body 701 and the side surfaces of the second and the third ceramic sintered bodies 702a and 702b facing each other. This recess portion 723 corresponds to a recess portion 808 of the multilayer substrate 803 shown in FIG. 15.

The multilayer substrate 803 has central electrode-connecting electrodes 809 each electrically connected to one end of the corresponding central electrode 807 and ground-connecting electrodes 810 each electrically connected to the other end of the corresponding central electrode 807, and in the multilayer substrate 803, a dielectric sheet, a capacitor electrode, a circuit electrode, and the like are incorporated, thereby forming a matching circuit.

The upper yoke 804 which is preferably made of a metal has an approximately box shaped configuration and includes an upper portion and four side portions 811.

The lower yoke 805 which is preferably made of a metal includes a bottom portion 812 and a pair of side portions 813. The lower yoke 805 is electrically connected to the ground-connecting electrodes 809 and is used as the ground. In the recess portion 808 of the multilayer substrate 803, the bottom portion 812 of the lower yoke 805 is placed and is fixed. When the side portions 813 of the lower yoke 805 and the pair of side portions 811 of the upper yoke 804 are bonded to each other, a metal case is formed, and as a result, a magnetic path is formed surrounding the permanent magnet 801, the central magnetic assembly 802, and the multilayer substrate 803.

EXAMPLE 1

Hereinafter, one example of a manufacturing method of a ceramic multilayer substrate of various preferred embodiments of the present invention will be described.

First, to 100 parts by weight of a powdered mixture composed of a powdered CaO—$Al_2O_3$—$SiO_2$-based glass and powdered $Al_2O_3$ in an amount equivalent thereto on a weight basis, 15 parts by weight of polyvinyl butyral, 40 parts by weight of isopropyl alcohol, and 20 parts by weight of toluene were respectively added and were then mixed for 24 hours by a ball mill to form a slurry, followed by defoaming the slurry. Subsequently, using a doctor blade method, substrate-forming ceramic green sheets having a thickness of 100 μm were formed.

Next, to 100 parts by weight of powdered $Al_2O_3$, 15 parts by weight of polyvinyl butyral, 40 parts by weight of isopropyl alcohol, 20 parts by weight of toluene, and 1 part by weight of polyoxyethylene nonylphenyl ether were respectively added and were then mixed for 24 hours by a ball mill to form a slurry, followed by defoaming the slurry. Subsequently, using a doctor blade method, connecting member-forming ceramic green sheets having a thickness of about 100 μm were formed.

Next, an Ag paste was filled in via holes provided in the substrate-forming ceramic green sheets and the connecting member-forming ceramic green sheets, so that via conductors were formed. Subsequently, a conductive paste was screen-printed on predetermined positions of the substrate-forming ceramic green sheets, thereby forming conductors.

Then, after 10 substrate-forming ceramic green sheets were laminated to each other, 2 connecting member-forming ceramic green sheets were provided thereon, and furthermore, 10 substrate-forming ceramic green sheets were provided on the connecting member-forming ceramic green sheets. The ceramic green sheets of the laminate thus formed were then bonded to each other by applying a pressure of about 100 MPa at a temperature of about 60° C., thereby forming a composite laminate.

Next, the composite laminate thus formed was fired at about 900° C. for about 30 minutes.

Subsequently, by ultrasonic cleaning, the connecting member-forming ceramic green sheets were removed from the fired composite laminate, so that the ceramic structure was formed.

EXAMPLE 2

Hereinafter, one example of a manufacturing method of a ceramic multilayer substrate of various preferred embodiments of the present invention will be described.

First, to 100 parts by weight of a powdered mixture composed of a powdered MgO—$Al_2O_3$—$SiO_2$-based glass and powdered $Al_2O_3$ in an amount equivalent thereto on a weight basis, 15 parts by weight of polyvinyl butyral, 40 parts by weight of isopropyl alcohol, and 20 parts by weight of toluene were respectively added and were then mixed for 24 hours by a ball mill to form a slurry, followed by defoaming the slurry. Subsequently, using a doctor blade method, first substrate-forming ceramic green sheets having a thickness of about 100 μm were formed.

Next, to 100 parts by weight of a powdered mixture composed of a powdered CaO—$Al_2O_3$—$SiO_2$-based glass and powdered $Al_2O_3$ in an amount equivalent thereto on a weight basis, 15 parts by weight of polyvinyl butyral, 40 parts by weight of isopropyl alcohol, and 20 parts by weight of toluene were respectively added and were then mixed for 24 hours by a ball mill to form a slurry, followed by defoaming the slurry. Subsequently, using a doctor blade method, second substrate-forming ceramic green sheets having a thickness of about 100 μm were formed.

Next, to 100 parts by weight of powdered $Al_2O_3$, 15 parts by weight of polyvinyl butyral, 40 parts by weight of isopropyl alcohol, 20 parts by weight of toluene, and 1 part by weight of polyoxyethylene nonylphenyl ether were respectively added and were then mixed for 24 hours by a ball mill to form a slurry, followed by defoaming the slurry. Subsequently, using a doctor blade method, connecting member-forming ceramic green sheets having a thickness of about 100 μm were formed.

Next, an Ag paste was filled in via holes provided in the first substrate-forming, the second substrate-forming, and the connecting member-forming ceramic green sheets, so that via conductors were formed. Subsequently, a conductive paste was screen-printed on predetermined positions of the substrate-forming ceramic green sheets, thereby forming conductors.

Then, after 10 first substrate-forming ceramic green sheets were laminated to each other, 2 connecting member-forming ceramic green sheets were provided thereon, and furthermore, 10 second substrate-forming ceramic green sheets were laminated on the connecting member-forming ceramic green sheets. The ceramic green sheets of the laminate thus formed were then bonded to each other by applying a pressure of about 100 MPa at a temperature of about 60° C., thereby forming a composite laminate.

Next, the composite laminate thus formed was fired at about 900° C. for about 30 minutes.

Subsequently, by ultrasonic cleaning, the connecting member-forming ceramic green sheets were removed from the fired composite laminate, so that the ceramic structure was formed.

According to the manufacturing method of the ceramic multilayer substrate of various preferred embodiments the present invention, when the ceramic green sheets are laminated to each other, the ceramic sintered bodies to be formed by firing can be placed at predetermined positions, and hence the positioning thereof can be easily performed. In addition, since the shape of the connecting members can be determined by filling a conductive paste in the ceramic green sheets, a ceramic structure having a connecting member as being designed can be formed.

The present invention is not limited to each of the preferred embodiments described above. Various changes and modifications may be possible within the scope of the claims. An embodiment obtained by appropriately combining the technical means disclosed in different embodiments is also included in the technological scope of the present invention.

What is claimed is:

1. A ceramic structure comprising:
    ceramic sintered bodies having conductors on surfaces thereof and provided adjacent to each other at a predetermined interval between each other; and
    connecting members provided between the ceramic sintered bodies; wherein
    the connecting members are made of a pillar-shaped sintered metal and electrically and mechanically connect the ceramic sintered bodies adjacent to each other through conductors on surfaces thereof; and
    the ceramic sintered bodies having conductors on surfaces thereof include a first, a second, and a third ceramic substrate, the first ceramic substrate and the second ceramic substrate are laminated to each other with at least one of the connecting members interposed therebetween so that a predetermined space is present between the ceramic substrates, the first ceramic substrate and the third ceramic substrate are laminated to each other with at least one of the connecting members interposed therebetween so that a predetermined space is present between the first and second ceramic substrates, the second ceramic substrate and the third ceramic substrate are provided at one major surface side of the first ceramic substrate so as to face each other with a predetermined space interposed between the second ceramic substrate and the third ceramic substrate, and said one major surface of the first ceramic substrate and side surfaces of the second and the third ceramic substrates facing each other define a recess portion.

2. The ceramic structure according to claim 1, wherein the connecting members and the conductors are connected to each other without solder interposed therebetween.

3. The ceramic structure according to claim 1, wherein the adjacent ceramic sintered bodies with the connecting members interposed therebetween are made of different ceramic materials.

4. The ceramic structure according to claim 1, wherein at least one of the adjacent ceramic sintered bodies with the connecting members interposed therebetween is a ceramic multilayer substrate.

5. A nonreciprocal circuit device comprising:
    a permanent magnet;
    a ferrite to which a direct-current magnetic field is applied by the permanent magnet;
    a plurality of central electrodes provided for the ferrite;
    a multilayer substrate having a matching circuit electrically connected to one end of each of the plurality of central electrodes; and
    a yoke electrically connected to the other end of each of the central electrodes so as to define a ground; wherein
    the multilayer substrate includes the ceramic structure according to claim 1; and
    a bottom portion of the yoke is fitted to the recess portion of the ceramic structure.

* * * * *